United States Patent
Tsai et al.

(10) Patent No.: US 9,252,008 B2
(45) Date of Patent: Feb. 2, 2016

(54) EPITAXIAL FORMATION MECHANISMS OF SOURCE AND DRAIN REGIONS

(71) Applicant: Taiwan Semiconductor Manufacturing Company, Ltd., Hsin-Chu (TW)

(72) Inventors: Chun Hsiung Tsai, Xinpu Township (TW); Meng-Yueh Liu, Taoyuan (TW); Kun-Hsiang Liao, Keelung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 435 days.

(21) Appl. No.: 13/739,781

(22) Filed: Jan. 11, 2013

(65) Prior Publication Data

US 2014/0198825 A1   Jul. 17, 2014

(51) Int. Cl.
 *G01K 7/00* (2006.01)
 *H01L 21/00* (2006.01)
 *G01K 3/04* (2006.01)

(52) U.S. Cl.
 CPC . *H01L 21/00* (2013.01); *G01K 3/04* (2013.01)

(58) Field of Classification Search
 None
 See application file for complete search history.

(56) References Cited

U.S. PATENT DOCUMENTS

| | | | |
|---|---|---|---|
| 6,137,149 A | 10/2000 | Kodama | |
| 6,238,989 B1 | 5/2001 | Huang et al. | |
| 7,030,012 B2 | 4/2006 | Divakaruni et al. | |
| 7,069,103 B1 * | 6/2006 | Bode et al. | 700/121 |
| 8,053,273 B2 | 11/2011 | Kammler et al. | |
| 2001/0023108 A1 | 9/2001 | Miyano et al. | |
| 2004/0101977 A1 * | 5/2004 | Celinska et al. | 438/3 |
| 2005/0077570 A1 | 4/2005 | Nishinohara | |
| 2006/0076559 A1 * | 4/2006 | Faure et al. | 257/49 |
| 2006/0084235 A1 | 4/2006 | Barr et al. | |
| 2006/0088968 A1 | 4/2006 | Shin et al. | |
| 2006/0115933 A1 | 6/2006 | Ye et al. | |
| 2006/0234504 A1 | 10/2006 | Bauer et al. | |
| 2006/0289902 A1 | 12/2006 | Ping et al. | |
| 2007/0259501 A1 | 11/2007 | Xiong et al. | |
| 2007/0287272 A1 | 12/2007 | Bauer et al. | |
| 2009/0075029 A1 | 3/2009 | Thomas et al. | |
| 2009/0267118 A1 | 10/2009 | Chakravarti et al. | |
| 2010/0025779 A1 | 2/2010 | Kammler et al. | |

(Continued)

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.

(Continued)

*Primary Examiner* — Lisa Caputo
*Assistant Examiner* — Nasir U Ahmed
(74) *Attorney, Agent, or Firm* — Slater & Matsil, L.L.P.

(57) ABSTRACT

The embodiments of mechanisms for monitoring thermal budget of an etch process of a cyclic deposition/etch (CDE) process to form an epitaxially grown silicon-containing material are descried to enable and to improve process control of the material formation. The monitoring is achieved by measuring the temperature of each processed wafer as a function of process time to calculate the accumulated thermal budget (ATB) of the wafer and to compare the ATB with a reference ATB (or optimal accumulated thermal budget, OATB) to see if the processed wafer is within an acceptable range (or tolerance). The results are used to determine whether to pass the processed wafer or to reject the processed wafer.

20 Claims, 9 Drawing Sheets

(56) References Cited

U.S. PATENT DOCUMENTS

| | | |
|---|---|---|
| 2010/0068898 A1* | 3/2010 | Moffatt et al. ............... 438/799 |
| 2011/0117732 A1 | 5/2011 | Bauer et al. |
| 2011/0124169 A1 | 5/2011 | Ye et al. |
| 2011/0212584 A9 | 9/2011 | Chakravarthi et al. |
| 2011/0266617 A1 | 11/2011 | Nakazawa et al. |
| 2011/0269287 A1 | 11/2011 | Tsai et al. |
| 2012/0056245 A1 | 3/2012 | Kang et al. |
| 2012/0181625 A1 | 7/2012 | Kwok et al. |
| 2012/0295421 A1 | 11/2012 | Brabant et al. |
| 2013/0056795 A1 | 3/2013 | Wu et al. |
| 2013/0157431 A1 | 6/2013 | Tsai et al. |
| 2013/0307076 A1 | 11/2013 | Chang et al. |
| 2013/0328126 A1 | 12/2013 | Tsai et al. |
| 2014/0170840 A1 | 6/2014 | Tsai et al. |

OTHER PUBLICATIONS

Fischer, P. R. et al., "Low Temperature Silcore Deposition of Undoped and Doped Silicon Films," 2006, pp. 203-215, vol. 3, Issue 2, ECS Transactions.

* cited by examiner

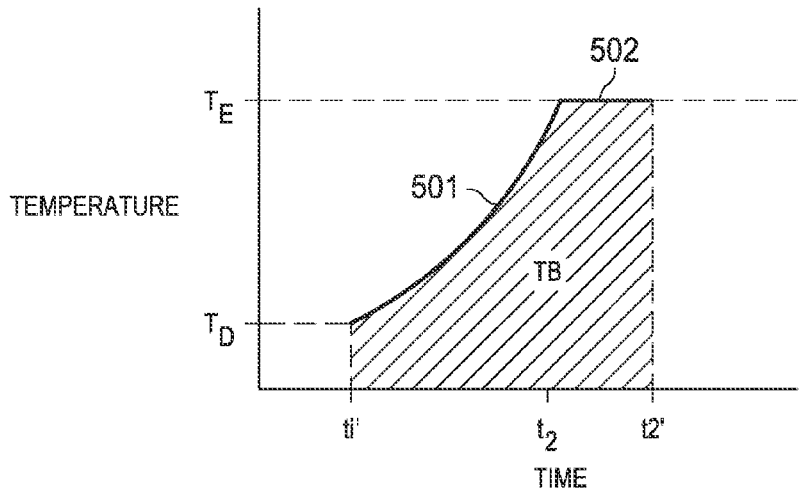
FIG. 6A
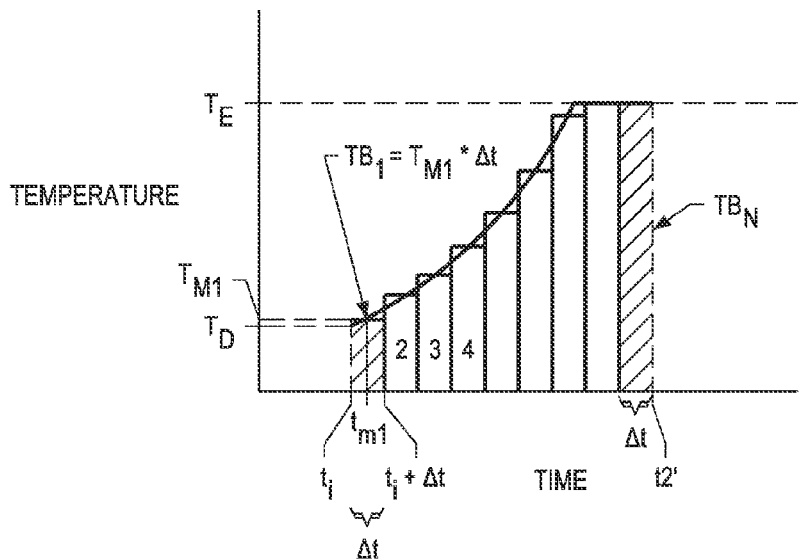
FIG. 6B
$$\sum_{t=t_i}^{t_j} \Delta t\, T(t) \approx \int_{t=t_i}^{t=t_j} T(t)\,dt = TB$$
FIG. 6C

EPITAXIAL FORMATION MECHANISMS OF SOURCE AND DRAIN REGIONS

CROSS-REFERENCES TO RELATED APPLICATIONS

The present application is related to U.S. application Ser. No. 13/493,626, entitled "EPITAXIAL FORMATION OF SOURCE AND DRAIN REGIONS" filed on Jun. 11, 2012. The present application is also related to U.S. application Ser. No. 13/719,826, entitled "Epitaxial Formation Mechanisms of Source and Drain Regions" filed on Dec. 19, 2012. Both above-mentioned applications are incorporated herein by reference in their entireties.

TECHNICAL FIELD

The present disclosure relates generally to the field of semiconductor devices and, more particularly, to integrated circuits and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIG. 6A shows a thermal budget of the etch process in a CDE unit cycle, in accordance with some embodiments.

FIG. 6B shows an approximate of the thermal budge of FIG. 6A, in accordance with some embodiments.

FIG. 6C shows an equation of summarizing the area pieces of FIG. 6B to approximate the thermal budge (TB) area of FIG. 6A, in accordance with some embodiments.

DETAILED DESCRIPTION

Figure 1:
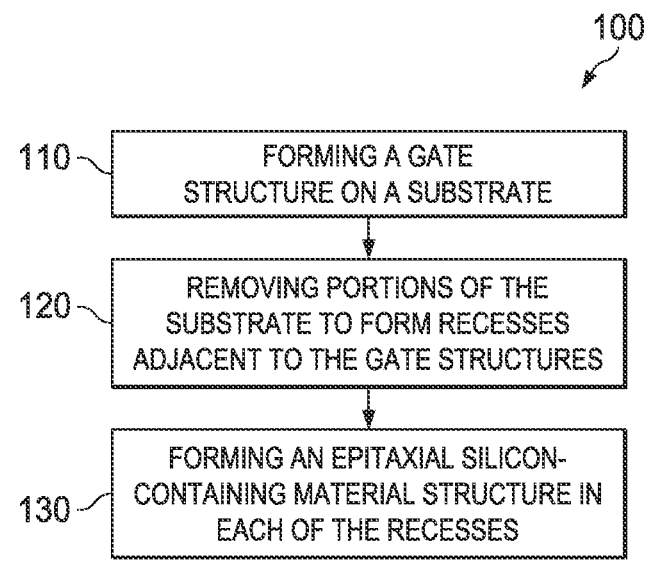
FIG. 1 is a flowchart illustrating an exemplary method of forming an integrated circuit.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

As semiconductor devices, such as metal-oxide-semiconductor field effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often epitaxially grows silicon (Si) to form raised source and drain features for an n-type device, and epitaxially grows silicon germanium (SiGe) to form raised source and drain features for a p-type device. Various techniques directed at shapes, configurations, and materials of these source and drain features have been implemented to further improve transistor device performance. Although existing approaches have been generally adequate for their intended purposes, they have not been entirely satisfactory in all respects.

The embodiments will be described with respect to specific embodiments in a specific context, namely a source/drain region for a complementary metal-oxide semiconductor (CMOS) transistor. The embodiments may also be applied, however, to other doped regions within a semiconductor device.

Illustrated in FIG. 1 is a flowchart of a method of forming an integrated circuit, in accordance with some embodiments. FIGS. 2A-2E are schematic cross-sectional views of an integrated circuit during various fabrication stages, in accordance with some embodiments. The integrated circuit may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, or other types of transistors. It is understood that FIGS. 2A-2E have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a gate structure over a substrate (block 110). The method 100 can include removing portions of the substrate to form recesses adjacent to the gate structure (block 120). The method 100 can also include forming a silicon-containing material structure in each of the recesses (block 130).

Figure 2A:
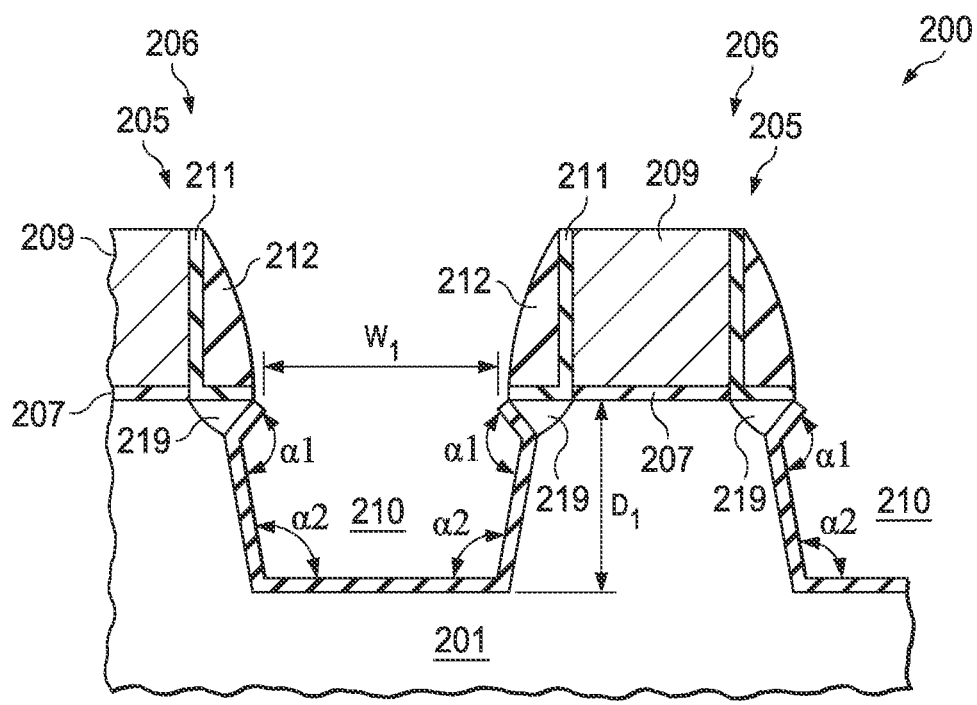
FIGS. 2A-2E are cross-sectional views of an integrated circuit during various fabrication stages, in accordance with some embodiments.

Referring now to FIGS. 2A-2E in conjunction with FIG. 1, an integrated circuit 200 can be fabricated in accordance with the method 100 of FIG. 1. In FIG. 2A, the integrated circuit 200 can be built on a substrate 201. Substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Substrate 201 may include an epitaxial layer (epi layer), and may be strained for performance enhancement.

In some embodiments forming n-type transistors, the substrate 201 can be a silicon substrate doped with a p-type dopant, such as boron (resulting in a p-type substrate). A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments, a gate stack 205 comprising a gate dielectric 207, a gate electrode 209, first spacers 211, and second spacers 212 may be formed over the substrate 201. The gate dielectric layer 207 includes a dielectric material, such as silicon oxide, silicon oxynitride, silicon nitride, a high-k dielectric material, or combinations thereof. Exemplary high-k dielectric materials include hafnium oxide (HfO$_2$), aluminum oxide (Al$_2$O$_3$), zirconium oxide (ZrO$_2$), gallium oxide (Ga$_2$O$_3$), titanium oxide (TiO$_2$), lanthanum oxide (La$_2$O$_3$), tantalum oxide (Ta$_2$O$_5$), gadolinium oxide (Gd$_2$O$_3$), yttrium oxide (Y$_2$O$_3$), hafnium dioxide-alumina (HfO$_2$—Al$_2$O$_3$) alloy, hafnium aluminum oxide (HfAlO), hafnium silicon oxide (HfSiO), hafnium silicon oxynitride (HfSiON), hafnium tantalum oxide (HMO), hafnium titanium oxide (HfTiO), hafnium zirconium oxide (HfZrO), titanium aluminum oxide (TiAlO), lanthanum aluminum oxide (such as LaAlO$_3$), other high-k dielectric material, or combinations thereof. The gate dielectric layer 207 may include a multilayer structure. For example, the gate dielectric layer 207 may include an interfacial layer formed over the substrate 201, and a high-k dielectric layer formed over the interfacial layer. The interfacial layer may be a silicon oxide layer formed by a thermal process or ALD process.

The gate electrode layer 209 is disposed over the gate dielectric layer 207. The gate electrode layer 209 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of the gate electrode layer 209 may be doped or undoped depending on design requirements of field effect transistor devices of integrated circuit 200. In some embodiments, the gate electrode layer 209 includes a work function layer tuned to have a proper work function for enhanced performance of the field effect transistor devices of integrated circuit 200. For example, in the depicted embodiment, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In furtherance of the present example, a conductive layer, such as an aluminum layer, is formed over the work function layer, such that the gate electrode layer 209 includes a work function layer disposed over the gate dielectric layer 207 and a conductive layer disposed over the work function layer.

Surrounding the gate stack 205 are the first spacers 211 and the second spacers 212. The gate stack 205 and the surrounding spacers, such as spacers 211 and 212, form a gate structure 206. The spacer layers may comprise SiN, oxynitride, SiC, SiON, oxide, and the like. However, as one of ordinary skill in the art will recognize, the first spacers 211 and the second spacers 212 as illustrated in FIG. 2A are intended to be merely illustrative and are not intended to limit the embodiments to these descriptions. Rather, any suitable number and combination of spacer layers and shapes may be utilized in order to form spacers for the gate stack 205, and any suitable combination of spacers may alternatively be utilized.

In some embodiments of forming an n-type transistor, n-type lightly-doped drains (LDDs) 219 can be formed in the substrate 201. Portions of the n-type LDDs 219 can be formed under the gate structure 205. The n-type LDDs 219 can be formed of n-type dopants (impurities). For example, the dopants can comprise phosphorous, arsenic, and/or other group V elements. In some embodiments, at least one thermal annealing process, e.g., a rapid thermal annealing (RTA) process, can be performed to activate the dopants of the n-type LDDs 219. In some embodiments of forming an n-type transistor, p-type pocket doped regions (not shown) can be formed in the substrate 201. The p-type pocket doped regions can be formed of p-type dopants (impurities). For example, the dopants can comprise boron and/or other group III elements.

FIG. 2A illustrates the formation of recesses 210 within the substrate 201. The recesses 210 may be formed using, e.g., a wet etch process selective to the material of the substrate 201 and uses the gate stack 205, the first spacers 211, and the second spacers 212 as a hard mask in order to form the recesses 210. For example, an etchant such as carbon tetrafluoride ($CF_4$), HF, tetramethylammonium hydroxide (TMAH), or combinations of thereof, or the like may be used to perform the wet etch and form the recesses 210. The recesses 210 provide an opening in the substrate 201 into which source/drain regions (whose formation is described further below with respect to FIGS. 2B-2E) will subsequently be formed.

Recess 210, formed below and between a spacer 212 surrounding gate structure 205 and a neighboring spacer 212 as shown in FIG. 2A, has a width $W_1$ of between about 50 Å and about 500 Å, in accordance with some embodiments. Recesses 210 may additionally undercut the first spacers 211 and/or the second spacers 212. Additionally, the wet etch process may be continued until the recesses 210 have a depth $D_1$ from a surface of the substrate 201. In some embodiments, $D_1$ is in a range from about 50 Å and about 600 Å. However, these dimensions are not intended to limit the present embodiments, as any suitable dimensions for the recesses 210 may alternatively be utilized.

The recesses 210 may be formed to have either an angular or rounded shape. In an embodiment in which the recesses 210 have an angular shape, the recesses 210 may be formed to have a first angle $\alpha_1$ along with top of the recesses 210 and a second angle $\alpha_2$ along the bottom of the recesses 210. In some embodiments, the first angle $\alpha_1$ is in a range from about 90° and about 180°. The second angle $\alpha_2$ is in a range from about 85° and about 170°, in accordance with some embodiments.

Referring to FIGS. 1 and 2B-2E, the method 100 can include forming an epitaxial silicon-containing material structure in each of the recesses (block 130). In some embodiments, the block 130 can include performing an epitaxial deposition/partial etch process and repeating the epitaxial deposition/partial etch process at least once. Such repeated deposition/partial etch process is also called a cyclic deposition/etch (CDE) process.

Figure 2B:
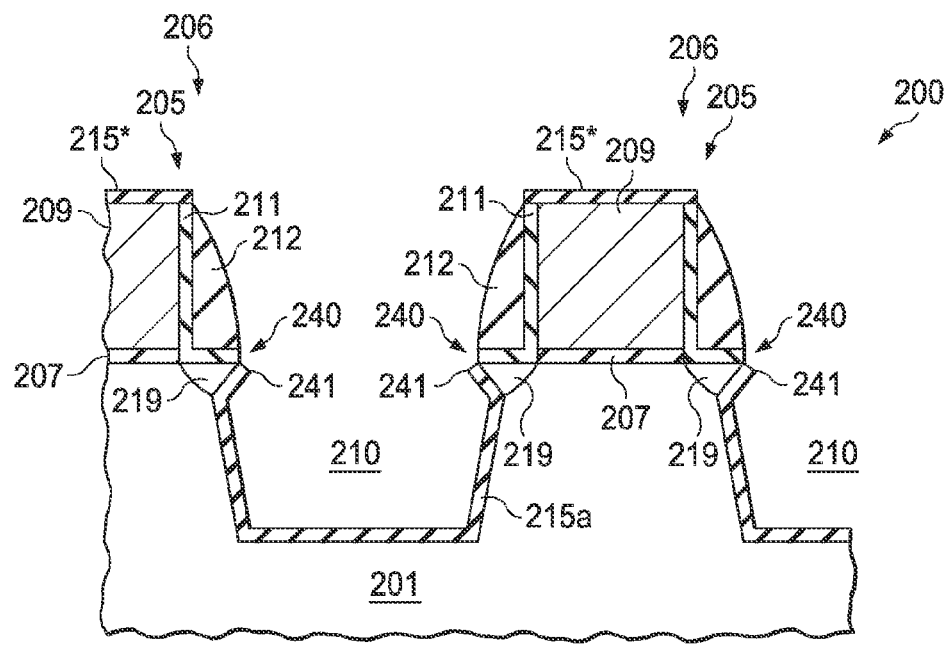
Figure 2C:
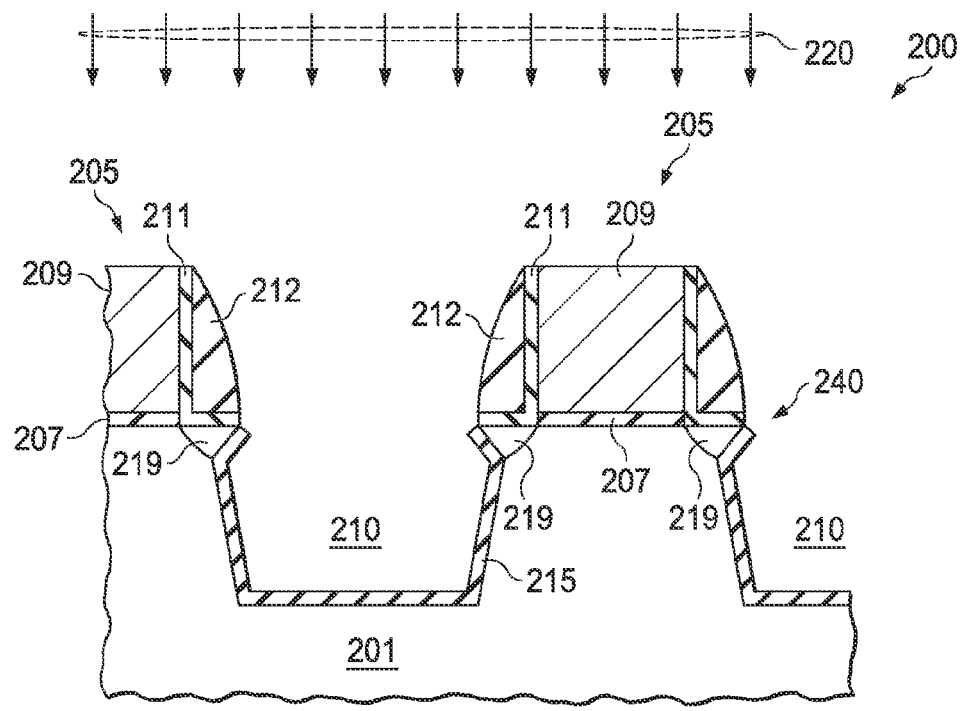
Figure 2D:
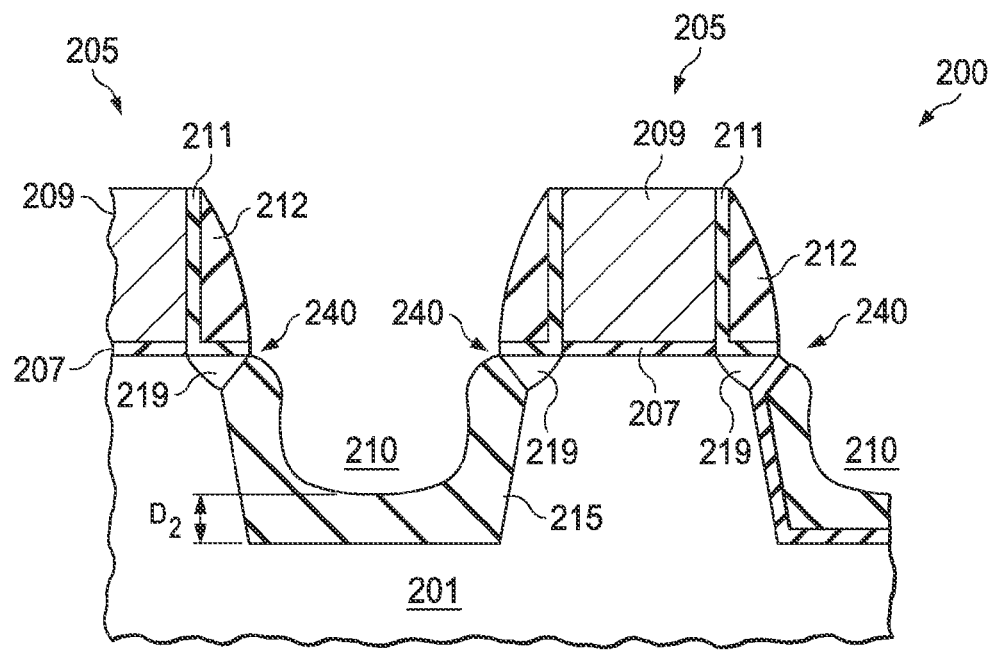
Figure 2E:
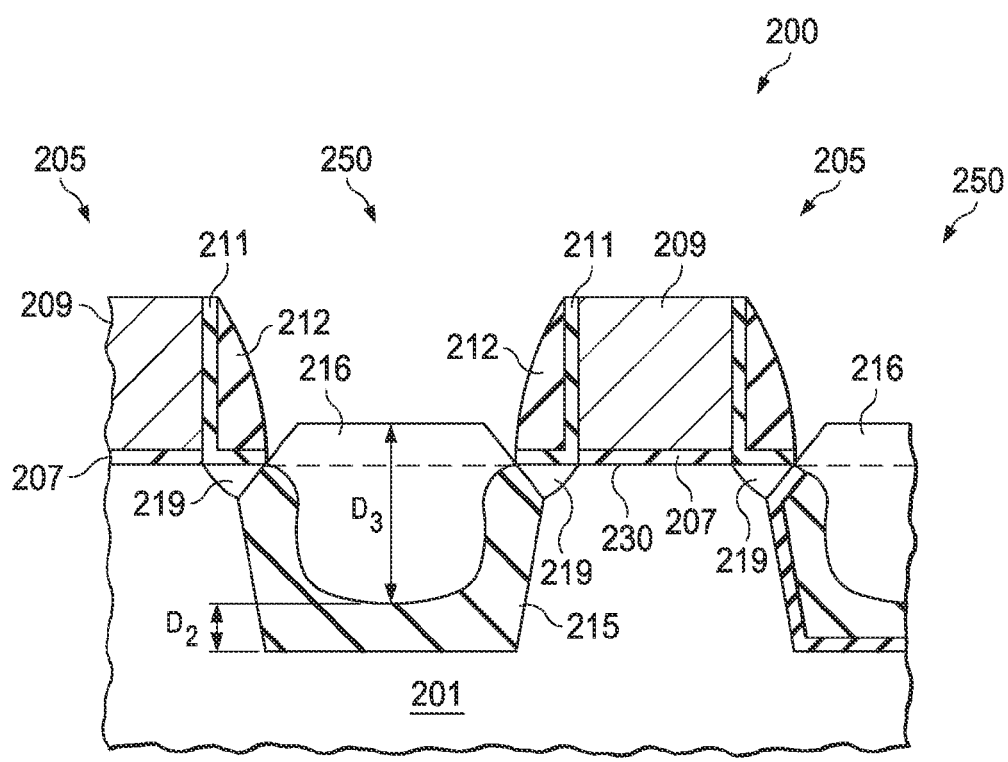

The block 130 may include epitaxially depositing a silicon-containing material (or layer) 215, in recesses 210 as shown in FIGS. 2B-2D, in accordance with some embodiments. Block 130 also may include depositing a silicon-containing layer 216 over the silicon-containing material 215 in recesses 210, as shown in FIG. 2E, in accordance with some embodiments.

The deposition of the silicon-containing material 215 includes in-situ doping the silicon-containing material 215, in accordance with some embodiments. For example, forming an n-type transistor can use an n-type doping precursor, e.g., phosphine ($PH_3$) and/or other n-type doping precursor. By using the in-situ doping process, the dopant profile of the silicon-containing material 215 can be desirably achieved. In some embodiments, the silicon-containing material 215 can be an n-type doped silicon layer that is doped with phosphorus (Si:P). In some embodiments, the silicon-containing material 215 can be an n-type doped silicon layer that is doped with both phosphorus and carbon (Si:CP). Carbon could impede the out-diffusion of phosphorus from the silicon-containing material 215. Other types of dopants may also be included. In some embodiments, the phosphorus dopant has a concentration in a range from about 0.1% to about 5% (atomic percent). In some embodiments, the carbon dopant has a concentration in a range from about 0.1% to about 5% (atomic percent).

In some embodiments, the silicon-containing material 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, the deposition of the silicon-containing material 215 can have a deposition temperature of about 750° C. or less. In other embodiments, the deposition temperature ranges from about 500° C. to about 750° C. The pressure of the deposition process is in a range from about 5 Torr to about 500 Torr, in accordance with some embodiments.

The deposition of the silicon-containing material 215 can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In some embodiments, the silicon-containing precursor can have a flow rate ranging from about 20 standard cubic centimeters per minute (sccm) to about 500 sccm. In other embodiments forming a p-type transistor, the silicon-containing material 215 can be made of at least one material, such as silicon, silicon germanium, other semiconductor materials, and/or any combinations thereof.

As mentioned above, the deposition of the silicon-containing material 215 includes in-situ doping the silicon-containing material 215, in accordance with some embodiments. For example, forming an n-type transistor can use an n-type doping precursor, e.g., phosphorous-containing gases such as phosphine ($PH_3$), arsenic-containing gases such as arsine ($AsH_3$), other n-type dopant-containing gases, or a combination thereof. In some embodiments, the n-type doping precursor can have a flow rate ranging from about 20 sccm to about 500 sccm. A carbon-containing gas, such as monomethylsilane (MMS), is also included to dope the silicon-containing material 215 with carbon, in accordance with some embodiments. In some embodiments, the carbon-containing gas has a flow rate ranging from about 10 sccm to about 600 sccm.

The silicon-containing material 215 in recesses 210 is epitaxial. The deposition process forms a thin epitaxial layer 215a of silicon-containing material in recesses 210 and an amorphous silicon-containing material 215* on gate electrode 209 and spacers 212, as shown in FIG. 2B in accordance with some embodiments. Referring to FIG. 2C, an etching (or partial etching) process 220 removes the amorphous silicon-containing material 215* and also a portion of the silicon-containing material 215a in recesses 210. The remaining silicon-containing material 215 is formed in each of the recesses 210. In some embodiments, the etching process 220 can use an etching gas including at least one of hydrogen chloride (HCl), chlorine ($Cl_2$), germanium hydride ($GeH_4$), other suitable etching gases, and/or any combinations thereof. The flow rate of the etching gas can range from about 50 sccm to about 750 sccm, in accordance with some embodiments. In some embodiments, the pressure of the etching process 220 ranges from about 5 Torr to about 500 Torr. In some embodiments, the etching process 220 can have an etching temperature of about 590° C. or less. In other embodiments, the etching temperature can range from about 500° C. to about 590° C. The process temperatures and pressures for the deposition process and etch process to form the silicon-containing material 215 are identical in some embodiments.

The etching process 220 would remove the amorphous silicon-containing material 215* over non-crystalline surface at a rate higher than the removal rate of epitaxial silicon-containing material 215. In addition, the etching process would remove a portion of epitaxial silicon-containing material 215 including the dislocations 241 near the gate corners 240.

The epitaxial deposition/partial etch process is repeated a number of times until a desired thickness $D_2$ is reached, as shown in FIG. 2D in accordance with some embodiments. As a result, such repeated deposition/partial etch process is called a cyclic deposition/etch (CDE) process. In some embodiments, $D_2$ is in a range from about 10 Å and about 500 Å. The dotted lines in recesses 210 are used to illustrate the multiple sub-layers formed by the epitaxial CDE process.

As mentioned above, the silicon-containing material 215 can be an n-type doped silicon layer that is doped with both phosphorus and carbon, in accordance with some embodiments. Carbon could impede the out-diffusion of phosphorus from the silicon-containing material 215. The phosphorus- and carbon-doped silicon layer can be referred to as a Si:CP layer. The dopants in the silicon-containing material 215 deposited by CDE have higher level of activation than implanted dopants. In some embodiments, the dopant activation level is in a range from about $2E20$ atoms/cm$^3$ to about $6E20$ atoms/cm$^3$. In contrast, the activation of implanted dopant at S/D is typically at about $1E20$ to $2E20$ atoms/cm$^3$ level. The higher activation level makes formation of in-situ doping of epitaxial grown silicon-containing desirable.

Following the CDE process, a selective epitaxial growth (SEG) process may be used to deposit additional silicon-containing film to fill the remaining recesses 210. The SEG process has a higher growth rate than the CDE process, in accordance with some embodiments. The SEG process is a selective deposition process and the silicon-containing film formed by this process deposits on epitaxial silicon-containing film, such as layer 215. SEG processes utilize simultaneous deposition and etch. In some embodiments, the surface of the silicon-containing layer 216, which is epitaxial, is leveled with silicon substrate surface 230. In some embodiments, the surface of the silicon-containing layer 216 is above silicon substrate surface 230, as shown in FIG. 2E. The thickness $D_3$ of the silicon-containing layer 216 is in a range from about 30 Å to about 400 Å, in some embodiments. In some embodiments, the silicon-containing layer 216 is doped with phosphorus (Si:P).

Layer 215 and layer 216 form the S/D regions 250. In some embodiments, the material and/or method of forming the silicon-containing layer 216 can be as same as or similar to those of the silicon-containing material 215. In some embodiments, the silicon-containing layer 216 may have a dopant concentration different from that of the silicon-containing material 215.

Figure 3A:
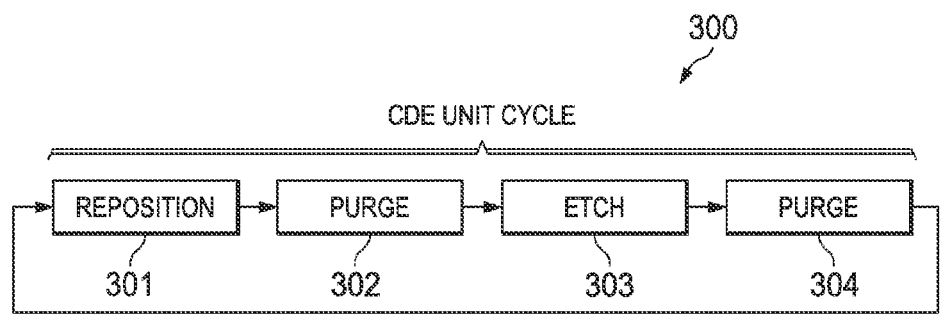
FIG. 3A is a process sequence of a CDE (cyclic deposition/etch) process in a process chamber, in accordance with some embodiments.

As mentioned above, the process to form the silicon-containing material 215 is a CDE process, which involves cyclic deposition and etch processes. FIG. 3A shows the process sequence of a CDE process 300 in a process chamber, in accordance with some embodiments. The process 300 include a deposition operation 301, a post-deposition pump operation 302, a partial-etch operation 303, and a post-etch pump operation 304, in accordance with some embodiments. The CDE process occurs in a process chamber. As mentioned above, the deposition operation 201 employs a silicon-containing gas, such as trisilane ($Si_3H_8$), di-silane ($Si_2H_6$), etc., as silicon source, and a dopant gas, such as $PH_3$, is also used to provide a dopant for the deposited silicon-containing material layer. In some embodiments, the pressure of the etching process 220 ranges from about 5 Torr to about 500 Torr. In some embodiments, the etching temperature can range from about 500° C. to about 590° C. In some embodiments, the deposition time is in a range from about 3 seconds to about 20 seconds. In some embodiments, the amount of the silicon-containing material 215 deposited in operation 301 is in a range from about 15 Å to about 80 Å during each CDE unit cycle, in accordance with some embodiments.

After deposition operation 301, a post-deposition pump operation 302 is used to remove the deposition gas from the process chamber. Once the chamber is removed of the deposition gases, the etch operation 303 follows. In some embodiments, the etch operation 303 employs HCl gas and $GeH_4$ gas. A non-reactive carrier gas, such as an inert gas, or $N_2$, is also used in the etch gas mixture in accordance with some embodiments. HCl and $GeH_4$ react with silicon to etch silicon. In some embodiments, $GeH_4$ acts as an etching catalyst to react with silicon to form SiGe, which is then removed by HCl. The etching temperature and pressure are maintained at the same levels as the deposition process, in some embodiments. The etch time is in a range from about 40 seconds to about 200 seconds, in some embodiments. The amount of the silicon-containing material 215 removed in operation 303 is in a range from about 5 Å and about 30 Å during each CDE unit cycle, in accordance with some embodiments.

Figure 3B:
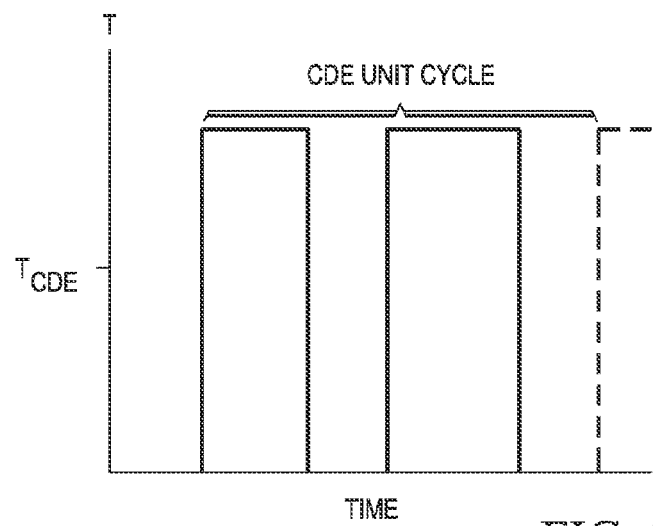
FIG. 3B shows process temperature of a CDE unit cycle, in accordance with some embodiments.
Figure 3C:
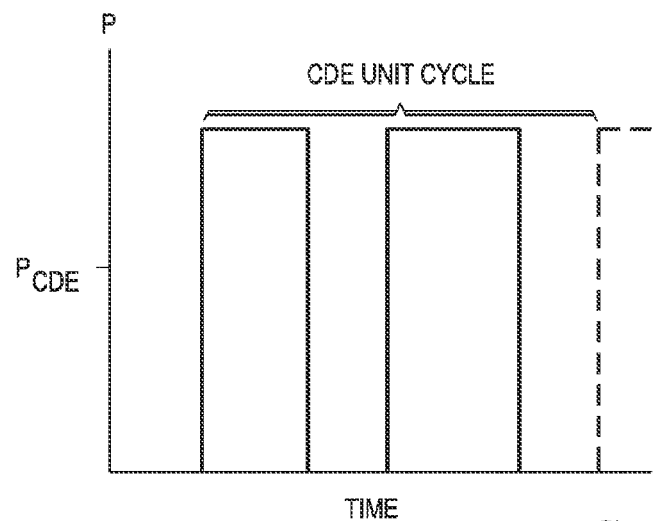
FIG. 3C shows process pressure of a CDE unit cycle, in accordance with some embodiments.

After the etching operation 303, the pump operation 304 follows to remove the etching gases used in operation 303 from the chamber. FIG. 3B shows process temperature of a CDE unit cycle when the process temperature is maintained constant (isothermal) $T_{CDE}$ throughout the CDE unit cycle, in accordance with some embodiments. FIG. 3C shows process pressure of a CDE unit cycle when the process pressure is maintained the same (isobaric) $P_{CDE}$ during deposition and etching processes, in accordance with some embodiments. Using a CDE process with constant temperature (isothermal) and the same process pressure (isobaric) during deposition and etch operations has the advantage of good process control and chamber matching. In each CDE unit cycle, a net thickness in a range from about 10 Å and about 40 Å is formed in a unit cycle in accordance with some embodiments. After operation 304, the process sequence involving operations 301, 302, 303, and 304 repeat again until the targeted thickness $D_2$ of silicon-containing material 215 is reached.

In the CDE process described above, $GeH_4$ is used in the etching gas mixture as an etch catalyst. However, the Ge (germanium) in the $GeH_4$ could be incorporated in the silicon-containing material 215 unintentionally. The Ge incorporated in the silicon-containing material 215 could result in increase in resistivity of silicon-containing material 215. For advanced technology nodes, such as N20 and beyond, such increase of resistivity is unacceptable because of its negative effects on Ion (on current) and device performance. In order to remove $GeH_4$ from the gas mixture, the process condition needs to be adjusted to compensate for the loss of $GeH_4$ as the etch catalyst. Without the usage of $GeH_4$, HCl needs to be dissociated to react with silicon.

Figure 4:
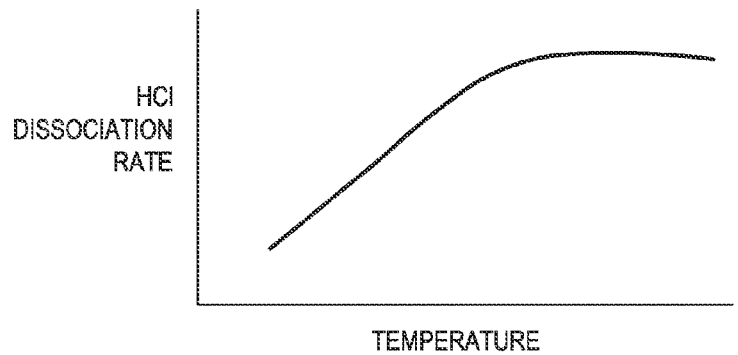
FIG. 4 shows a diagram of dissociation rate of HCl as a function of temperature, in accordance with some embodiments.

FIG. 4 shows a diagram of dissociation rate of HCl in the process chamber as a function of etch temperature, in accordance with some embodiments. The dissociation rate and reactivity of HCl increases with temperature. HCl dissociates into hydrogen and chlorine at high temperature. The etch rate of HCl becomes significant at a temperature near 600° C. Therefore, the etch temperature should be close to or higher than 600° C. In some embodiments, the etch temperature of the etch process without $GeH_4$ is in a range from about 600° C. to about 700° C. By setting the processing temperature of the etch process higher, the etch time can also be shortened to increase process throughput. In addition, the etch gas flow rate and pressure can be increased to increase the etch rate and to shorten etch process time.

Figure 5A:
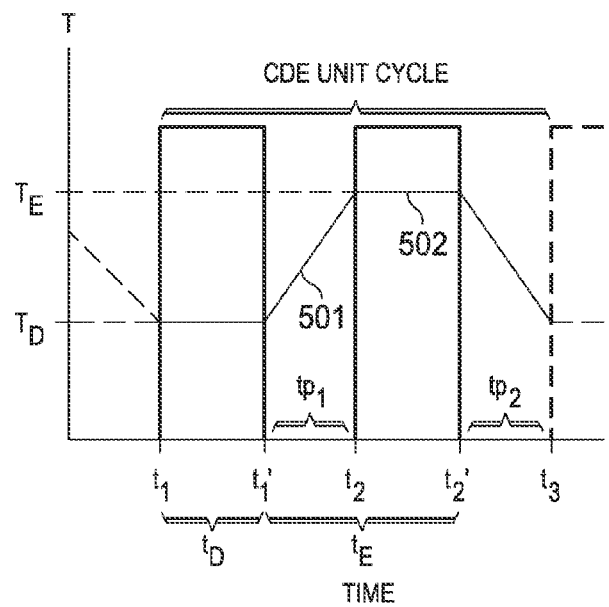
FIG. 5A shows a temperature diagram as a function of process time of a CDE unit cycle, in accordance with some embodiments.
Figure 5B:
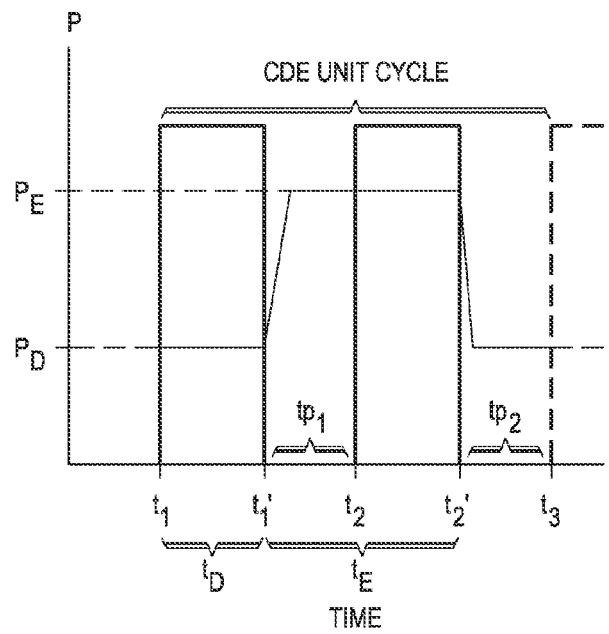
FIG. 5B shows a temperature diagram as a function of process time of a CDE unit cycle, in accordance with some embodiments.

FIG. 5A shows a temperature diagram as a function of process time of a CDE unit cycle, in accordance with some embodiments. FIG. 5A shows that the deposition occurs at $T_D$ and the etch occurs at $T_E$. FIG. 5B shows a pressure diagram as a function of process time of a CDE unit cycle, in accordance with some embodiments. FIG. 5B shows that the deposition pressure occurs at $P_D$ and at $P_E$ for the etch.

The deposition process gas mixture has been described above. $T_D$ is in a range from about 500° C. to about 590° C., in accordance with some embodiments. $T_E$ is in a range from about 600° C. to about 670° C., in accordance with some embodiments. $P_D$ is in a range from about 5 Ton to about 100 Torr, in accordance with some embodiments. $P_E$ is in a range from about 50 Ton to about 500 Torr, in accordance with some embodiments. The flow rate of HCl is in a range from about 50 sccm to about 30 slm (standard liters per minute). A non-reactive carrier gas, such as an inert gas, or $N_2$, is also used in the etch gas mixture in accordance with some embodiments. In some embodiments, the carrier gas a flow rate in a range from about 2 slm to about 10 slm.

The deposition process starts at $t_1$ and occurs for the duration of $t_D$. As mentioned above, the deposition time ($t_D$) is in a range from about 3 seconds to about 20 seconds. The etch gas mixture is introduced into the process chamber after the supply of the deposition gas mixture is terminated (at $t_1'$) at the end of the deposition process. As shown in FIG. 5B, the pressure of the chamber is increases to $P_E$ soon after $t_1'$. As shown in FIG. 5A, the temperature of the process chamber increases from $T_D$ to $T_E$, which is a set etch temperature over a period of time, $t_{p1}$. As mentioned above, $T_D$ is in a range from about 500° C. to about 590° C. and $T_E$ is in a range from about 600° C. to about 670° C., in accordance with some embodiments. The HCl dissociation rate is not negligible at 500° C. Therefore, HCl in the etch gas mixture etches the deposited silicon-containing material deposited in the same CDE unit cycle starting at the beginning of the pump cycle between $t_1'$ to $t_2$ and continues till $t_2'$, in accordance with some embodiments. By allowing the etch process to occur during the pump after deposition step, the etch time can be shortened. In some embodiment the etch time, $t_E$, is in a range from about 3 seconds to about 30 seconds. The higher etch temperature and/or pressure enable the etch time $t_E$ to be shortened, especially the higher etch temperature. A short etch time, $t_E$, would shorten the overall process time of a CDE unit cycle and consequently the overall process time of the CDE process.

The temperature profile 501 between $t_1'$ and $t_2$ is curved, as shown in FIG. 5A in accordance with some embodiments. The temperature profile 501 reflects the temperature of a substrate, which sits on a substrate support, in a CDE process chamber. However, profile 501 can vary from chamber to chamber due to variations of process chambers, such as chamber hardware configuration, gas flow control, etc. As shown in FIG. 4, the dissociation rate of HCl, consequently the reactivity of the etch gas mixture, depends on chamber temperature. Forming the silicon-containing material (or layer) 215 in recesses 210 to form the source and drain regions needs to be repeatable to ensure consistent device performance. Because the etch process in the CDE unit cycle is temperature sensitive, it is important to control the temperature profile to ensure the thermal budget (TB) of the etch process is matched. If the thermal budget mismatch exceed a control limit (CL), the processed substrate runs the risk of having mismatched process results, such as film thickness and film quality, etc., that would impact the device performance outside the device specification.

Thermal budget (TB) is the accumulation of temperature as a function of time, in accordance with some embodiments. FIG. 6A shows that the TB of the etch process in a CDE unit cycle is the total area under the temperature profiles (501 and 502), in accordance with some embodiments. To ensure consistent etch performance (or result), TB needs to be monitored and controlled to meet the target value within a range of acceptable variation. FIG. 6 B shows that the area under profiles 501 and 502 is divided into small pieces with a same $\Delta t$, in accordance with some embodiments. A temperature measurement is taken in each piece. The area of $\Delta t * T(t)$ can be calculated for each area piece in FIG. 6B and can be added together to appropriate the area TB of FIG. 6A. For example, the temperature measured at $t_{m1}$, which is between $t_i$ (or initial time) and $t_i + \Delta t$, is $T_{m1}$. The area $TB_1$ of the first area piece is $T_{m1} * \Delta t$. Similarly measurement and calculation can be performed for remaining etch period. For example, the etch starts at $t_i$ and finishes at $t_f$ (final time). The temperature measurement is taken for N times. N is an integer number. The total calculated thermal budget area is calculated by adding all calculated TB pieces, such as $TB_1$, $TB_2$, ..., and $TB_N$, together. The smaller the $\Delta t$ is in FIG. 6B, the more closely the total area of the area pieces would match the TB area of FIG. 6A. FIG. 6C shows an equation of summarizing the area pieces of FIG. 6B to approximate the thermal budge (TB) area of FIG. 6A.

As described above, the $\Delta t$ should be as small as possible to better approximate TB. However, there is a limitation on how small $\Delta t$ is in practice. $\Delta t$ is limited by a variety of factors, such as limitation of temperature sampling frequency of temperature sensor used, and signal sampling frequency of data acquisition (DAQ) system used. Different temperature sensors have different capabilities of temperature sampling frequencies. Examples of temperature sensors include, but are not limited to, thermocouples, resistance temperature detectors (RTD), pyrometers, and infrared sensors. These temperature sensors have different temperature sensing and sampling capabilities. DAQ system for temperature data may include devices (or hardware) for signal conditioning and for analog-to-digital conversion. In addition, the DAQ system may include computing (or processing) unit with software for computing the temperature data and accumulated ($\Delta t * T(t)$ described above.

Figure 7A:
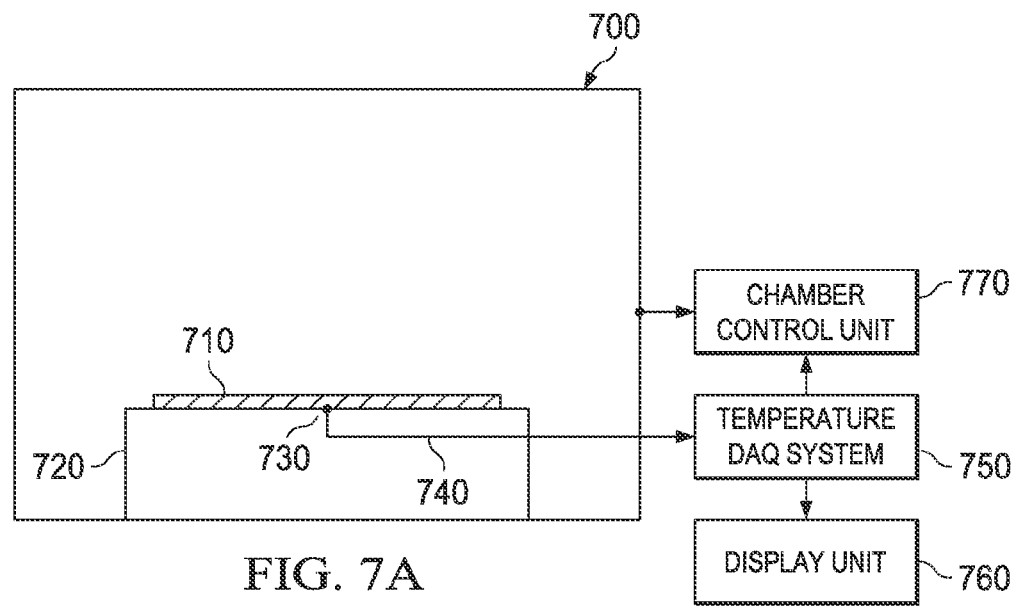
FIG. 7A shows a temperature data acquisition (DAQ) system for a substrate in a CDE processing chamber, in accordance with some embodiments.

FIG. 7A shows a temperature DAQ system 750 for a substrate 710 in a CDE processing chamber 700, in accordance with some embodiments. Chamber 700 in FIG. 7A is greatly simplified and many key components, such as gas supplied and pumps, and controlled, etc. are not shown. FIG. 7A shows that substrate 710 sits on a substrate support 720, which has heating and cooling elements (not shown) to affect temperature of substrate 4 710. A temperature sensing device 730, such as a thermocouple, a thermistor, a pyrometer, or other applicable device, is placed next to the backside of substrate 710 to measure its temperature. The results of the measurements are sent to the temperature DAQ system 750 through cable 740. FIG. 7A shows that temperature DAQ system 750 is connected to chamber control unit 770 and display unit 760. The data collected and analyzed by the temperature DAQ system 750 are sent to chamber control unit 770 to control substrate processing. The data collected and analyzed by the temperature DAQ system 750 are also sent to display unit 760 to inform the operator or user the status of the substrate.

Figure 7B:
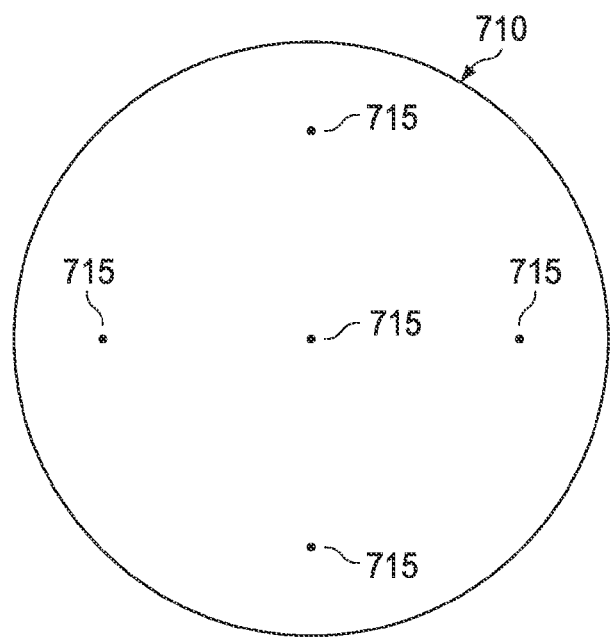
FIG. 7B shows 5 temperature measurement locations on the backside of substrate, in accordance with some embodiments.

FIG. 7A shows a single temperature measurement location. However, there could more than one measurement locations, such as 3, 5, 7, or more. For example, FIG. 7B shows 5 temperature measurement locations 715 on the backside of substrate 710. In some embodiments, temperature is measured on the front side of substrate 710.

As described above, Δt is limited by a number of factors. In some embodiments, Δt is in a range from about 1 microseconds (μs) to about 1 second. In some embodiments, Δt is in a range from about 0.1 milliseconds (ms) to about 10 ms.

The temperature DAQ system 750 computes the accumulated temperature and time data (Δt*T(t)) (or accumulated thermal budget, ATB) from the beginning till the end of the etch process (from $t_i$ to $t_f$), in accordance with some embodiments. An optimal accumulated Δt*T(t) (or optimal accumulated thermal budget, OATB) with a tolerance, such as a certain percentage of variation from OATB, can be established for an etch process of a CDE unit cycle for forming the silicon-containing material 215. If ATB for a particular substrate is within the tolerance from the OATB, the particular substrate is considered "passing" the screening criteria and is allowed to continue with further processing. Otherwise, the substrate is considered out of specification and the processing chamber is also considered out of control limit.

Figure 7C:
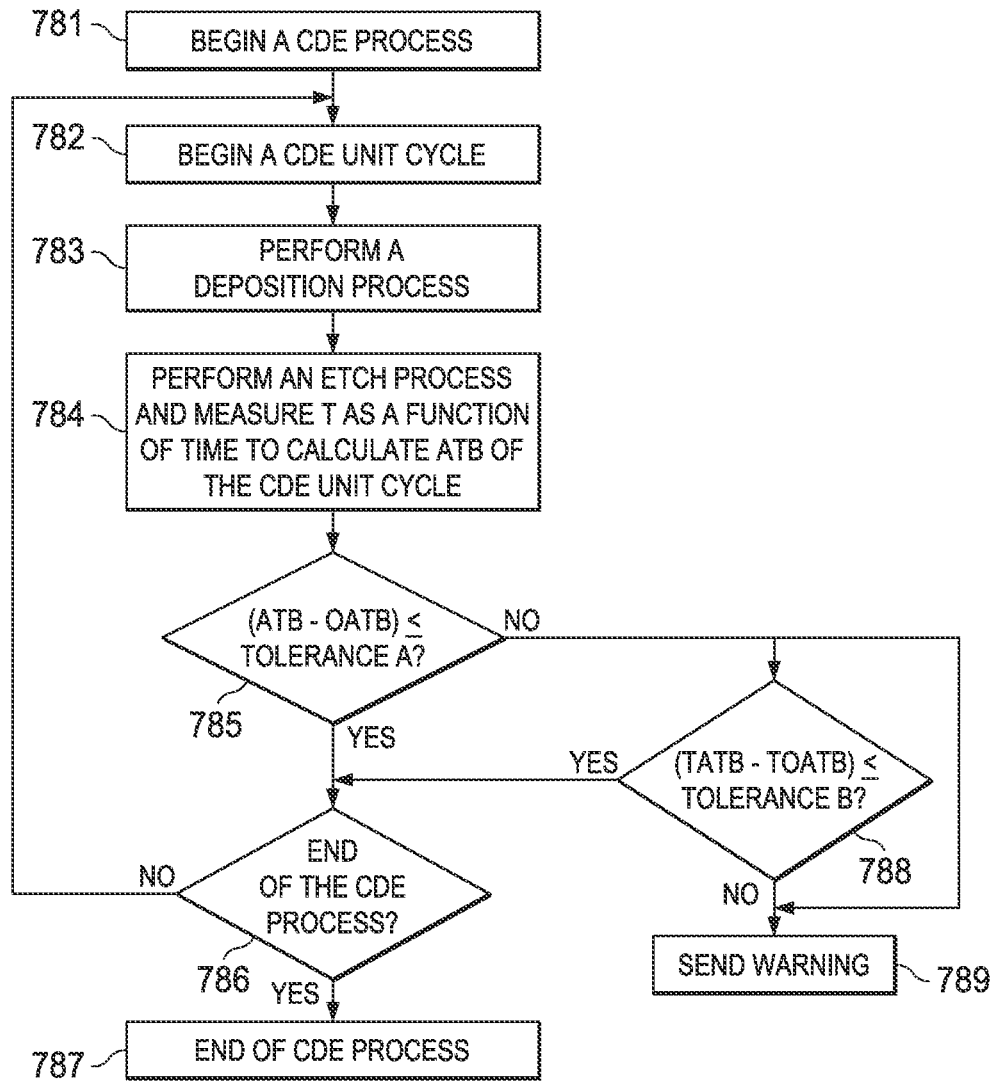
FIG. 7C shows a process flow of process control of an etch process of a CDE process, in accordance with some embodiments.

FIG. 7C shows a process flow 780 of process control of an etch process of a CDE process, in accordance with some embodiments. Process flow starts at operation 781 of beginning the CDE process. As mentioned above, CDE process starts after the recesses 210 are formed. CDE process includes a number of CDE unit cycle. Therefore, operation 781 is followed by operation 782 of beginning a CDE unit cycle. A CDE unit cycle includes a deposition and an etching process. A deposition operation (or process) 783 is performed after the CDE unit cycle starts. The deposition process is part of the CDE unit cycle described above. After the deposition operation 783, an etch operation (or process) 784 is performed. During the etch operation 784, substrate temperature is measured as a function of time to calculate the accumulated thermal budget (ATB) of the CDE unit cycle. The ATB is then compared against an established OATB to determine if the variation is within a tolerance A at operation 785. The tolerance A is a certain percentage of OATB. In some embodiments, the tolerance A is in a range from about 1% to about 10% of OATB. In some embodiments, the tolerance A is in a range from about 1% to about 5% of OATB. In some embodiments, the tolerance A is in a range from about 1% to about 3% of OATB. The tolerance depends on the sensitivity of the process. The more sensitive the process is to the temperature, the smaller the range of variation is allowed.

If the degree of variation is determined at operation 785 to be within the tolerance level, the process may continue to operation 786 for a determining operation 786 of whether the process the reached the end of CDE process (or CDE cycles) with a targeted number of CDE unit cycles completed. If the answer is yes, the end of CDE process is reach at operation 787. Otherwise, the process loops back to operation 782 to start another CDE unit cycle.

On the other hand, if the variation is determined to be outside the tolerance level at operation 785, the process continues to operation 789 to send a warning of exceeding thermal budget (TB), such as ATB, being beyond tolerance of optimal thermal budget (OTB), such as OATB, at operation 789. The substrate received warning at operation 789 might be scrapped or reworked. Alternatively, the process continues to operation 788 to determine if the total ATB (TATB) accumulated for the substrate (after one or more CDE unit cycle) is within a tolerance B of total OATB (TOATB) targeted. There could be an total optimum accumulated thermal budget (TOATB) for the entire CDE process. A substrate can fail OATB tolerance for a CDE unit cycle and passes the TOATB tolerance for the entire CDE process. If the answer is yes at operation 788, the process can go to operation 786 to determine whether it has reached the end of CDE process. If the answer is no at operation 788, the process continues to operation 789 to send a warning of exceeding thermal budget (TB), such as TATB, being beyond tolerance of optimal thermal budget (OTB), such as OATB, at operation 789. As mentioned above, the substrate received warning at operation 789 might be scrapped or reworked.

Figure 7D:
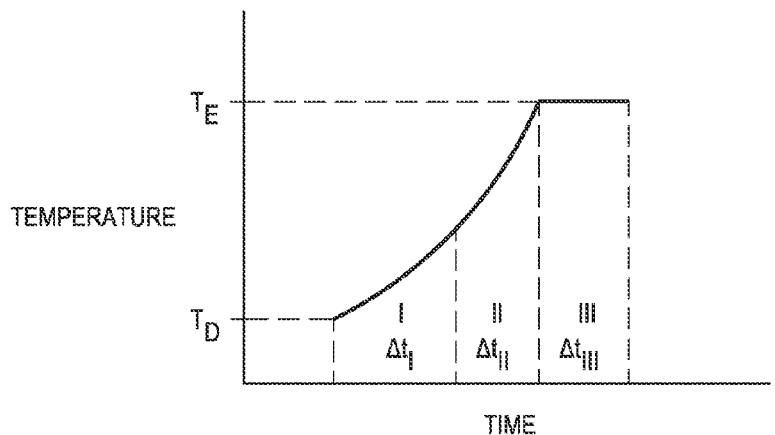
FIG. 7D shows the etch process of a CDE unit cycle is divided into different temperature-monitoring zones, in accordance with some embodiments.

In the description above in FIG. 6B, the etch process of an CDE unit cycle is treated as an overall process with the Δt being the same throughout the entire etch cycle. When the temperature profile during the etch process is very steep or substantially non-linear, the monitoring of the thermal budget can be divided into different zones. FIG. 7D shows the etch process of a CDE unit cycle is divided into 3 temperature-monitoring zones, I, II, and III, in accordance with some embodiments. During zone I, temperature ramps up in a steep range and etch rate varies significantly within this zone, in comparison to zones II and III. In zone III, the process temperature and etch rate are substantially constant. Due to the varying rates of temperature and etch rate changes in different zones, the temperature-monitoring duration, Δt, may be set differently in different zones, such as $\Delta t_I$, $\Delta t_{II}$, and $\Delta t_{III}$. With the temperature profile shown in FIG. 7D, $\Delta t_I < \Delta t_{II} < \Delta t_{III}$, in accordance with some embodiments. In some other embodiments, Δt is set the same in different zones. However, the tolerance levels are set differently in different zones, such as tolerance I<tolerance II<tolerance III. In some other embodiments, both the temperature-monitoring durations, $\Delta t_I$, $\Delta t_{II}$, and $\Delta t_{III}$, and the tolerances, tolerance I, tolerance II, and tolerance III, are set differently in different zones. In some embodiments, Δt is smallest (or sampling frequency is the highest) in a zone with steepest temperature variation.

Figure 7E:
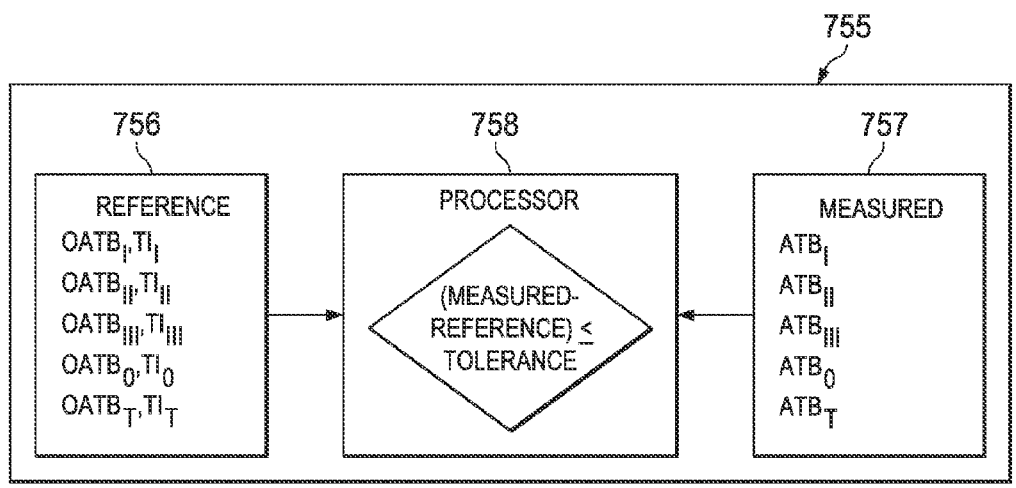
FIG. 7E shows a diagram of a data analysis module of a temperature DAQ system, in accordance with some embodiments.

FIG. 7E shows a diagram of a data analysis module 755 of temperature DAQ system 750, in accordance with some embodiments. FIG. 7E shows that the data analysis module 755 includes a memory 756, which stores reference (or golden) thermal budgets (OATBs) of the etch process, which includes Zone I OATB (or $OATB_I$), Zone II OATB (or $OATB_{II}$), Zone III OATB (or $OATB_{III}$), and overall OATB (or $OATB_O$) of a CDE unit cycle, and total OATB (or $OATB_T$) for the entire CDE process. FIG. 7E also shows that memory 756 includes tolerance (Tls) of the etch process, which includes Zone I Tl (or $Tl_I$), Zone II Tl (or $Tl_{II}$), Zone III Tl (or $Tl_{III}$), and overall Tl ($Tl_O$) of a CDE unit cycle, and total Tl ($Tl_T$) for the entire CDE process. The reference TBs and corresponding tolerance values (Tls) are established based on process characterization.

The data analysis module 755 also includes a memory 757, which stores measured thermal budgets (ATBs) of the etch process for a particular substrate, which includes Zone I ATB (or $ATB_I$), Zone II ATB (or $ATB_{II}$), Zone III ATB ($ATB_{III}$), and overall ATB (or $ATB_O$) of a CDE unit cycle, and total ATB (or $ATB_T$) for the entire CDE process. The data in memories 756 and 757 are compared in processor 758 to determine if the process, by calculating the difference between the measured and reference values, is within or outside tolerance level (Tls).

The inventive embodiments of mechanisms for monitoring the thermal budgets of an etch process of a CDE unit cycle and/or overall CDE process may also apply to other temperature sensitive processes, such as dopant annealing and others. The examples of applicable annealing processes include, but are not limited to, rapid thermal anneal (RTA), spike anneal, flash anneal and laser anneal. Native oxide by a dry etching process (plasma etch) is also temperature sensitive. For advanced process technologies, such as N20 and beyond, device performance control becomes more and more critical. The usage of temperature control could become more prevalent.

The embodiments of mechanisms for monitoring thermal budget of an etch process of a cyclic deposition/etch (CDE) process to form an epitaxially grown silicon-containing material are descried to enable and to improve process control of the material formation. The monitoring is achieved by measuring the temperature of each processed wafer as a function of process time to calculate the accumulated thermal budget (ATB) of the wafer and to compare the ATB with a reference ATB (or optimal accumulated thermal budget, OATB) to see if the processed wafer is within an acceptable range (or tolerance). The results are used to determine whether to pass the processed wafer or to reject the processed wafer.

In some embodiments, a method of monitoring thermal budget of a process is provided. The method includes initiating the process, and measuring temperature of the substrate during the process. The method also includes calculating accumulated thermal budget (ATB) of the process. The method further includes determining if a difference between the calculated ATB and a reference ATB (OATB) is within a tolerance. If the answer is yes, the substrate is sent on for further processing. Otherwise, the substrate is flagged with warning.

In some other embodiments, a method of monitoring thermal budget of a process is provided. The method includes initiating the process, and process temperature of at least a portion of the process varies with time. Process result of the process is sensitive to temperature. The method also includes measuring temperature of the substrate during the process, and calculating accumulated thermal budget (ATB) of the process. The method further includes determining if a difference between the calculated ATB and a reference ATB is within a tolerance. If the answer is yes, the substrate is sent on for further processing. Otherwise, the substrate is flagged with warning.

In yet some other embodiments, a system for monitoring thermal budget of a substrate during a process is provided. The system includes at least one temperature sensor for measuring temperature of the substrate periodically during the process. The system also includes a temperature data acquisition (DAQ) system, and the temperature DAQ system collects and analyzes the temperature data sent from the at least one temperature sensor to determine accumulated thermal budget (ATB) of the process. The ATB is used to determine if the ATB passes thermal budget criteria of the process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of monitoring thermal budget of a process, the method comprising:
    initiating the process on a substrate;
    calculating a measured accumulated thermal budget (ATB) of the process by accumulating process temperature data over time;
    calculating a difference between the measured ATB and a reference ATB (OATB); and
    determining if the difference is within a tolerance;
    if the difference is within tolerance, further processing the substrate;
    if the difference is not within tolerance, flagging the substrate with a warning.

2. The method of claim 1, wherein the process is an etch process in a cyclic deposition/etch (CDE) unit cycle for forming an epitaxial silicon-containing layer.

3. The method of claim 1, wherein the process is an etch process in a cyclic deposition/etch (CDE) process for forming an epitaxial silicon-containing layer, wherein the CDE process includes a plurality of CDE unit cycles, and wherein the calculated measured ATB is accumulated over a number of CDE unit cycles.

4. The method of claim 1, wherein process temperature of at least a first portion of the process varies with time, and wherein a process result of the process is sensitive to temperature.

5. The method of claim 4, wherein at least a second portion of the process has a substantially constant process temperature.

6. The method of claim 1, wherein a temperature of the process is in a range from about 600° C. to about 700 ° C.

7. The method of claim 1, wherein the temperature of the substrate is measured in a regular time period, wherein the time period is in range from about 1 micro-seconds (μs) to about 1 second.

8. The method of claim 1, wherein the temperature of the substrate is measured in a regular time period, wherein the time period is in range from about 0.1 ms to about 10 ms.

9. The method of claim 1, wherein the temperature of the substrate is measured by thermocouple, thermistor, or pyrometer.

10. The method of claim 1, wherein the process is divided into a plurality of zones, and wherein measuring temperature of the substrate is conducted at different frequencies in different zones in the plurality of zones.

11. The method of claim 10, wherein temperature measurement frequency is highest in one of the plurality of zones with steepest temperature variation.

12. The method of claim 10, wherein the reference ATB and the tolerance are established by correlating with device performance.

13. The method of claim 1, wherein temperature of the substrate is measured at multiple locations on the substrate.

14. The method of claim 1, wherein the substrate flagged with a warning is either re-worked or scrapped.

15. The method of claim 1, wherein the tolerance is in a range from about 1% to about 3% of the OATB.

16. A method of monitoring thermal budget of a process, the method comprising:
    initiating the process on a substrate, wherein process temperature of at least a portion of the process varies with time, and wherein a process result of the process is sensitive to temperature;
    calculating a measured accumulated thermal budget (ATB) of the process by accumulating substrate temperature data over time;
    calculating a difference between the measured ATB and a reference ATB (OATB); and
    determining if the difference is within a tolerance;
    if the difference is within tolerance, further processing the substrate;
    if the difference is not within tolerance, flagging the substrate with a warning.

17. A system for monitoring thermal budget of a substrate during a process, the system comprising:
- at least one temperature sensor for measuring a temperature of the substrate as a function of time during the process; and
- a temperature data acquisition (DAQ) system, wherein the temperature DAQ system collects and analyzes temperature data sent from the at least one temperature sensor to determine a measured accumulated thermal budget (ATB) of the process, wherein the measured ATB is compared to a reference ATB (OATB) to determine if the measured ATB passes thermal budget criteria of the process.

18. The system of claim 17, wherein the temperature DAQ system further comprises:
- a first memory including OATB data and tolerance values for the OATB data,
- a second memory including measured ATB data for a substrate, and
- a processor to determine if the measured ATB data for the substrate are within tolerance values of the OATB data.

19. The system of claim 17, wherein the temperature DAQ system includes devices for signal conditioning and for analog-to-digital conversion.

20. The system of claim 17, further comprising:
- a chamber control unit, wherein the chamber control unit is connected to the temperature DAQ system, and wherein a result of determining if the measured ATB passes thermal budget criteria of the process is sent to the chamber control unit to control processing of the substrate.

* * * * *